United States Patent
Takenaga et al.

(10) Patent No.: US 7,953,512 B2
(45) Date of Patent: May 31, 2011

(54) SUBSTRATE PROCESSING SYSTEM, CONTROL METHOD FOR SUBSTRATE PROCESSING APPARATUS AND PROGRAM STORED ON MEDIUM

(75) Inventors: Yuichi Takenaga, Nirasaki (JP);
Tatsuya Yamaguchi, Nirasaki (JP);
Wenling Wang, Nirasaki (JP);
Toshihiko Takahashi, Nirasaki (JP);
Masato Yonezawa, Nirasaki (JP)

(73) Assignee: Tokyo Electron Limitetd, Tokyo (JP)

( * ) Notice: Subject to any disclaimer, the term of this patent is extended or adjusted under 35 U.S.C. 154(b) by 366 days.

(21) Appl. No.: 12/230,788

(22) Filed: Sep. 4, 2008

(65) Prior Publication Data
US 2009/0078197 A1   Mar. 26, 2009

(30) Foreign Application Priority Data

Sep. 26, 2007  (JP) ................................. 2007-249054

(51) Int. Cl.
*G06F 19/00* (2006.01)
*B05C 11/00* (2006.01)

(52) U.S. Cl. ....................................... 700/121; 118/708
(58) Field of Classification Search .................. 700/121; 118/708
See application file for complete search history.

(56) References Cited

U.S. PATENT DOCUMENTS
2002/0014483 A1 * 2/2002 Suzuki et al. .................. 219/486
2002/0045146 A1 * 4/2002 Wang et al. ..................... 432/49

FOREIGN PATENT DOCUMENTS
JP   2002-110552   4/2002

* cited by examiner

*Primary Examiner* — Ryan A Jarrett
(74) *Attorney, Agent, or Firm* — Smith, Gambrell & Russell, LLP

(57) ABSTRACT

The present invention provides a substrate processing system, a control method for a substrate processing apparatus, and a program for the system and/or method, each of which is intended to achieve effective control for a film-forming amount on processed substrates. The substrate processing system includes a substrate processing unit adapted for forming a film on each of the plurality of substrates; a pattern obtaining unit adapted for obtaining information about an arrangement pattern concerning arrangement of unprocessed substrates and processed substrates among the plurality of substrates; and a memory unit adapted for storing therein an arrangement/film-forming-amount model indicative of influence exerted on the film-forming amount on the substrates by the arrangement of the unprocessed substrates and processed substrates among the plurality of substrates. A calculation unit calculates an estimated film-forming amount on the substrates, in the case of the arrangement pattern, based on the arrangement/film-forming-amount model. Then, a determination unit determines whether or not the estimated film-forming amount calculated by the calculation unit is within a predetermined range. If the estimated film-forming amount calculated by the calculation unit is determined to be within the predetermined range, a control unit will control and drive the substrate processing unit to process the substrates.

6 Claims, 7 Drawing Sheets

|  | | THE NUMBER OF SHEETS OF THE PROCESSED WAFERS ON THE ROUTE (N1 TO N2) | | | | |
|---|---|---|---|---|---|---|
|  |  | 0~7 | 8~32 | 33~57 | 58~82 | 83~107 |
| THE SLOT NUMBER OF EACH MONITOR WAFER | 6 | 0.03 | 0.03 | 0.04 | 0.04 | 0.05 |
|  | 32 | 0.03 | 0.03 | 0.04 | 0.04 |  |
|  | 58 | 0.03 | 0.03 | 0.04 |  |  |
|  | 84 | 0.03 | 0.03 |  |  |  |
|  | 110 | 0.03 |  |  |  |  |

FIG. 6

|  | | THE FILM THICKNESS UPON THE PREVIOUS TIME [nm] | FLUCTUATION OF THE FILM THICKNESS DUE TO ALTERATION OF THE ARRANGEMENT OF THE UNPROCESSED WAFERS [nm] | ESTIMATED FILM THICKNESS [nm] |
|---|---|---|---|---|
| THE SLOT NUMBER OF EACH MONITOR WAFER | 6 | 30.10 | -0.42 | 29.68 |
|  | 32 | 29.90 | -0.42 | 29.48 |
|  | 58 | 29.80 | -0.42 | 29.38 |
|  | 84 | 29.90 | -0.42 | 29.48 |
|  | 110 | 29.70 | 0.00 | 29.70 |

FIG. 7

| | |
|---|---|
| UPPER LIMIT OF AN AVERAGE FOR ALL OF THE WAFERS [nm] | 31.00 |
| LOWER LIMIT OF THE AVERAGE FOR ALL OF THE WAFERS [nm] | 29.00 |
| UPPER LIMIT OF AN AVERAGE OF EACH WAFER [nm] | 31.50 |
| LOWER LIMIT OF THE AVERAGE OF EACH WAFER [nm] | 38.50 |
| FACE TO FACE UNIFORMITY [±%] | 3.00 |

FIG. 8

|  |  | THE FILM THICKNESS UPON THE PREVIOUS TIME [nm] | FLUCTUATION OF THE FILM THICKNESS DUE TO ALTERATION OF THE ARRANGEMENT OF THE UNPROCESSED WAFERS [nm] | ESTIMATED FILM THICKNESS [nm] | TARGET FILM THICKNESS [nm] | AMOUNT OF CHANGE OF THE TEMPERATURE [°C] | ESTIMATED FILM THICKNESS AFTER THE TEMPERATURE IS CONTROLLED [nm] |
|---|---|---|---|---|---|---|---|
| THE SLOT NUMBER OF EACH MONITOR WAFER | 6 | 30.10 | -0.42 | 29.68 | 30.00 | 0.53 | 30.00 |
| | 32 | 29.90 | -0.42 | 29.48 | 30.00 | 0.87 | 30.00 |
| | 58 | 29.80 | -0.42 | 29.38 | 30.00 | 1.03 | 30.00 |
| | 84 | 29.90 | -0.42 | 29.48 | 30.00 | 0.87 | 30.00 |
| | 110 | 29.70 | 0.00 | 29.70 | 30.00 | 0.50 | 30.00 |

FIG. 9

| SET TEMPERATURE VALUES AFTER CHANGED [°C] |
|---|
| 760.53 |
| 760.87 |
| 761.03 |
| 760.87 |
| 760.50 |

FIG. 10

| | |
|---|---|
| UPPER LIMIT OF THE TEMPERATURE OF ZONE 1 (TOP-ZONE) [°C] | 761.00 |
| LOWER LIMIT OF THE TEMPERATURE OF ZONE 1 (TOP-ZONE) [°C] | 759.00 |
| UPPER LIMIT OF THE TEMPERATURE OF ZONE 2 (CTR-TOP-ZONE) [°C] | 761.00 |
| LOWER LIMIT OF THE TEMPERATURE OF ZONE 2 (CTR-TOP-ZONE) [°C] | 759.00 |
| UPPER LIMIT OF THE TEMPERATURE OF ZONE 3 (CTR-ZONE) [°C] | 761.00 |
| LOWER LIMIT OF THE TEMPERATURE OF ZONE 3 (CTR-ZONE) [°C] | 759.00 |
| UPPER LIMIT OF THE TEMPERATURE OF ZONE 4 (CTR-BTM-ZONE) [°C] | 761.00 |
| LOWER LIMIT OF THE TEMPERATURE OF ZONE 4 (CTR-BTM-ZONE) [°C] | 759.00 |
| UPPER LIMIT OF THE TEMPERATURE OF ZONE 5 (BTM-ZONE) [°C] | 761.00 |
| LOWER LIMIT OF THE TEMPERATURE OF ZONE 5 (BTM-ZONE) [°C] | 759.00 |

FIG. 11

SUBSTRATE PROCESSING SYSTEM, CONTROL METHOD FOR SUBSTRATE PROCESSING APPARATUS AND PROGRAM STORED ON MEDIUM

CROSS REFERENCE TO RELATED APPLICATIONS

This application is based on the prior Japanese Patent Application No. 2007-249054 filed on Sep. 26, 2007, the entire contents of which are incorporated herein by reference.

BACKGROUND OF THE INVENTION

1. Field of the Invention

The present invention relates to a substrate processing system, a control method for a substrate processing apparatus and a program for the system and method.

2. Background Art

In a process for manufacturing semiconductors, the substrate processing apparatus, for example, a vertical-type heating apparatus, adapted for processing each semiconductor wafer (hereinafter, referred to as a "wafer"), i.e., a substrate, is used. In the vertical-type heating apparatus, a holding tool, which is configured for holding multiple sheets of wafers in a multistage fashion, is provided in a vertical-type heating furnace, such that a film forming process for each substrate can be performed by CVD (Chemical Vapor Deposition), oxidation or the like process (for example, see Patent Document 1).

Patent Document 1: TOKUKAI No. 2002-110552 (JP 2002-110552A)

SUMMARY OF THE INVENTION

In such a process, it is necessary to control a film-forming amount (or amount of film formation) on each substrate processed by the substrate processing apparatus.

In light of the above, it is an object of the present invention to provide a new substrate processing system, a new control method for the substrate processing apparatus and a new program for the system and method, each of which is intended to achieve significantly effective control of the film-forming amount on each processed substrate.

The substrate processing system according to the present invention comprises: a substrate processing unit which is adapted for storing therein a plurality of substrates including unprocessed substrates and processed substrates respectively arranged in a multistage fashion as well as adapted for providing a heating process and a gas supplying process to the plurality of substrates, so as to form a film on each of the plurality of substrates; a pattern obtaining unit adapted for obtaining information about an arrangement pattern concerning arrangement of the unprocessed substrates and processed substrates among the plurality of substrates; a first memory unit adapted for storing therein an arrangement/film-forming-amount model indicative of influence exerted on a film-forming amount on the substrates by the arrangement pattern concerning the arrangement of the unprocessed substrates and processed substrates among the plurality of substrates; a calculation unit adapted for calculating an estimated film-forming amount on the substrates, in the case of the arrangement pattern obtained by the pattern obtaining unit, based on the arrangement/film-forming-amount model stored in the first memory unit; a determination unit adapted for determining whether or not the estimated film-forming amount calculated by the calculation unit is within a predetermined range; and a control unit adapted for controlling and driving the substrate processing unit to process the substrates when the estimated film-forming amount calculated by the calculation unit is determined to be within the predetermined range.

In the substrate processing system according to this invention, the calculation unit may further calculate the estimated film-forming amount on a plurality of monitor substrates included in the plurality of substrates, and the determination unit may further determine whether or not the estimated film-forming amount and uniformity thereof on each of the plurality of monitor substrates are within predetermined ranges, respectively.

The substrate processing system according to this invention may further comprises: a second memory unit adapted for storing therein a temperature/film-forming-amount model indicative of influence exerted on the film-forming amount on the substrates by a processing temperature for the substrates; and a temperature determination unit adapted for determining the processing temperature, based on the temperature/film-forming-amount model stored in the second memory unit, when the estimated film-forming amount calculated by the calculation unit is determined to be out of the predetermined range, wherein the control unit controls the substrate processing unit, based on the processing temperature determined by the temperature determination unit.

In the substrate processing system according to this invention, the substrate processing unit may include a plurality of heating units each adapted for heating the substrates, and the temperature determination unit may determine the processing temperature corresponding to each of the plurality of heating units, based on the temperature/film-forming-amount model stored in the second memory unit, when the uniformity of the estimated film-forming amount calculated by the calculation unit is determined to be out of the predetermined range.

Alternatively, the control method according to the present invention is configured for controlling a substrate processing apparatus which is adapted for storing therein a plurality of substrates including unprocessed substrates and processed substrates respectively arranged in a multistage fashion as well as adapted for providing a heating process and a gas supplying process to the plurality of substrates, so as to form a film on each of the plurality of substrates, the method comprising the steps of: obtaining information about an arrangement pattern concerning arrangement of the unprocessed substrates and processed substrates among the plurality of substrates; calculating an estimated film-forming amount on the substrates, in the case of the arrangement pattern, based on an arrangement/film-forming-amount model indicative of influence exerted on a film-forming amount on the substrates by the arrangement pattern concerning the arrangement of the unprocessed substrates and processed substrates among the plurality of substrates; determining whether or not the estimated film-forming amount calculated in the calculating step is within a predetermined range; and controlling the substrate processing apparatus when the estimated film-forming amount calculated in the calculating step is determined to be within the predetermined range.

Alternatively, the present invention provides a computer program configured for driving a computer to perform a control method for a substrate processing apparatus, wherein the method is configured for controlling the substrate processing apparatus which is adapted for storing therein a plurality of substrates including unprocessed substrates and processed substrates respectively arranged in a multistage fashion as well as adapted for providing a heating process and a gas supplying process to the plurality of substrates, so as to form a film on each of the plurality of substrates, and wherein the method comprises the steps of: obtaining information about an arrangement pattern concerning arrangement of the unprocessed substrates and processed substrates among the plurality of substrates; calculating an estimated film-forming amount on the substrates, in the case of the arrangement pattern, based on an arrangement/film-forming-amount model indicative of influence exerted on a film-forming amount on the substrates by the arrangement pattern concerning the arrangement of the unprocessed substrates and processed substrates among the plurality of substrates; determining whether or not the estimated film-forming amount calculated in the calculating step is within a predetermined range; and controlling the substrate processing apparatus when the estimated film-forming amount calculated in the calculating step is determined to be within the predetermined range.

Alternatively, the present invention provides a storage medium configured for storing therein a computer program for driving a computer to perform a control method for a substrate processing apparatus, wherein the method is configured for controlling the substrate processing apparatus which is adapted for storing therein a plurality of substrates including unprocessed substrates and processed substrates respectively arranged in a multistage fashion as well as adapted for providing a heating process and a gas supplying process to the plurality of substrates, so as to form a film on each of the plurality of substrates, and wherein the method comprises the steps of: obtaining information about an arrangement pattern concerning arrangement of the unprocessed substrates and processed substrates among the plurality of substrates; calculating an estimated film-forming amount on the substrates, in the case of the arrangement pattern, based on an arrangement/film-forming-amount model indicative of influence exerted on a film-forming amount on the substrates by the arrangement pattern concerning the arrangement of the unprocessed substrates and processed substrates among the plurality of substrates; determining whether or not the estimated film-forming amount calculated in the calculating step is within a predetermined range; and controlling the substrate processing apparatus when the estimated film-forming amount calculated in the calculating step is determined to be within the predetermined range.

Thus, according to the present invention, the substrate processing system, control method for the substrate processing apparatus and program for the system and method, each of which is intended to achieve significantly effective control of the film-forming amount on each processed substrate, can be provided.

BRIEF DESCRIPTION OF THE DRAWINGS

FIG. 6 is a schematic diagram showing one example of a model used for estimating a film thickness.

FIG. 7 is a schematic diagram showing estimated film thicknesses obtained by calculation.

FIG. 8 is a schematic diagram showing one example of a reference film-thickness table.

FIG. 9 is a schematic diagram showing an optimum amount of temperature change for each monitor wafer.

FIG. 10 is a schematic diagram showing each set temperature obtained by calculation.

FIG. 11 is a schematic diagram showing one example of a reference temperature table.

DETAILED DESCRIPTION OF THE INVENTION

Examples

Hereinafter, one embodiment of the present invention will be described, with reference to the drawings.

Figure 1:
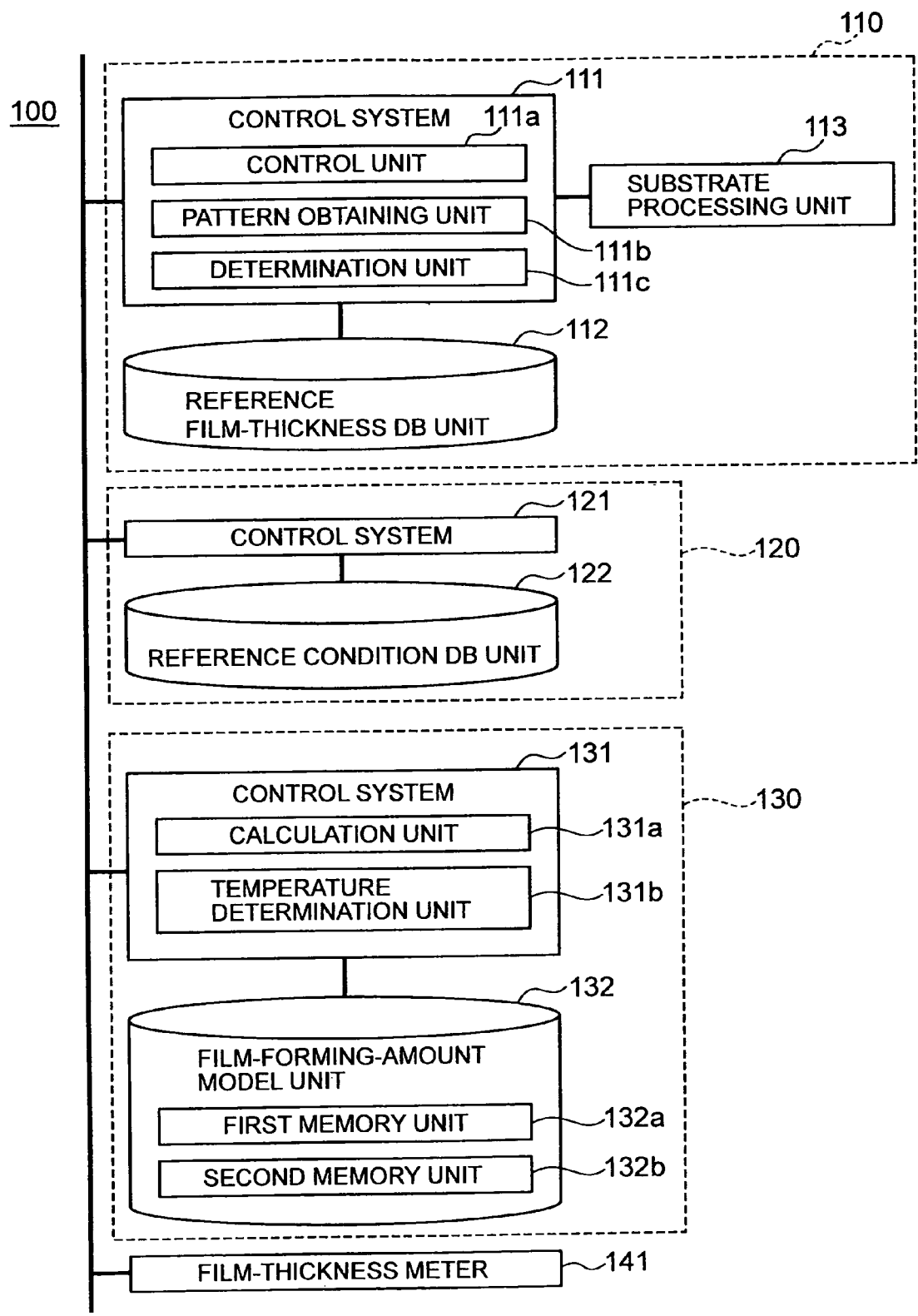
FIG. 1 is a diagram illustrating the substrate processing system related to a first embodiment of the present invention.

FIG. 1 is a diagram illustrating a substrate processing system 100 related to a first embodiment of the present invention. The substrate processing system 100 is adapted for processing substrates (e.g., wafers), and includes a substrate processing apparatus 110, a host computer 120, a server computer 130, and a film-thickness meter 141. These components are connected with one another via a network.

The substrate processing apparatus 110 is adapted for processing the substrates (e.g., semiconductor wafers), and includes a control system 111, a reference film-thickness DB unit 112, and a substrate processing unit 113.

The control system 111 is adapted for controlling the substrate processing unit 113. The control system 111 can function as the following units (1) to (3), respectively:

(1) a control unit 111a adapted for controlling the substrate processing unit such that the substrate processing unit will process the substrates;

(2) a pattern obtaining unit 111b adapted for obtaining an arrangement pattern concerning unprocessed substrates and processed substrates among the plurality of substrates; and (3) a determination unit 111c adapted for determining whether or not an estimated film-forming amount is within a predetermined range.

The reference film-thickness DB unit 112 is a memory unit adapted for storing therein a reference film-thickness table that is used as a reference for determining whether or not the process condition should be altered.

The substrate processing unit 113 is configured to process the substrates with a reaction gas, with the substrates being arranged in a multistage fashion. Namely, the substrate processing unit 113 is adapted for forming a film on each of the substrates arranged in the multistage fashion, while providing heat and gas onto each substrate. The control system 111 and substrate processing unit 113 will be further detailed later.

The host computer 120 is adapted for controlling the substrate processing apparatus 110, and includes a control system 121 and a reference condition DB unit 122. For example, the control system 121 is composed of a CPU (Central Processing Unit) and adapted for controlling the entire system of the host computer 120 as well as the substrate processing apparatus 110. The reference condition DB unit 122 is a memory unit adapted for storing therein a reference temperature table that is used as a reference for determining whether or not the process condition is applicable.

The server computer 130 serves as a computer for supporting the control performed by the host computer 120 for the substrate processing apparatus 110 and includes a control system 131 and a film-forming-amount model DB unit 132.

For example, the control system 131 is composed of a CPU (Central Processing Unit) and adapted for controlling the entire system of the server computer 130. The control system 131 can function as the following units (1) and (2), respectively:

(1) a calculation unit 131a adapted for calculating the estimated film-forming amount on each substrate; and (2) a temperature determination unit 131b adapted for determining a process temperature, based on a temperature/film-forming-amount model, when the estimated film-forming amount obtained by calculation is determined to be out of the predetermined range.

The film-forming-amount model DB unit 132 is a memory unit adapted for storing therein a film-forming-amount model used for calculating each process condition. The film-forming-amount model DB unit 132 can function as the following units (1) and (2), respectively:

(1) a first memory unit 132a adapted for storing therein an arrangement/film-forming-amount model indicative of influence, exerted on the film-forming amount on each substrate, due to arrangement of unprocessed substrates and processed substrates among the plurality of substrates; and (2) a second memory unit 132b adapted for storing therein the temperature/film-forming-amount model indicative of influence, exerted on the film-forming amount on each substrate, due to the process temperature for the substrate.

The film-thickness meter 141 is composed of a device, for example, an ellipsometer, which is adapted for measuring the film thickness of each substrate.

(Details of the Control System 111 and Substrate Processing Unit 113)

Figure 2:
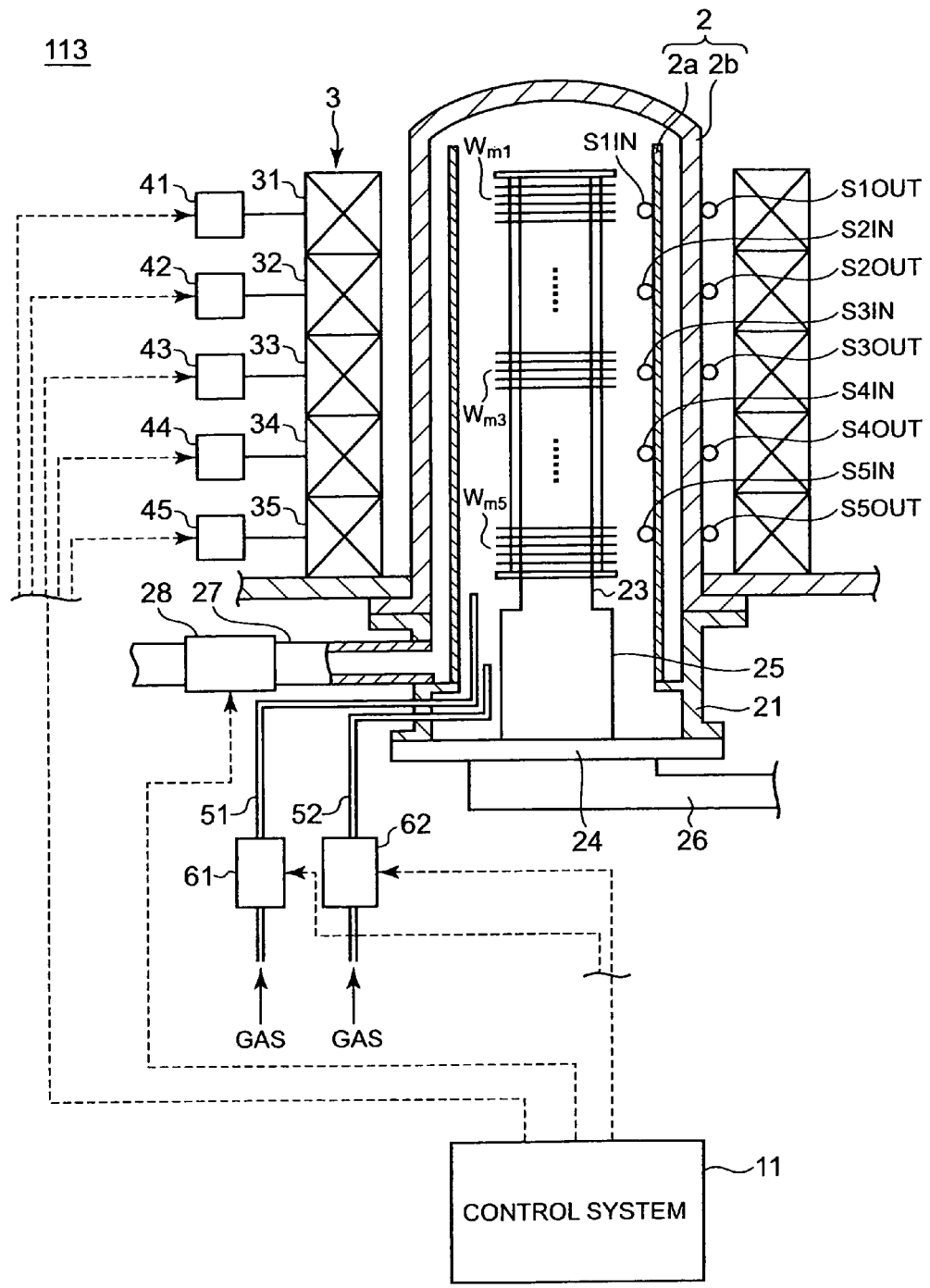
FIG. 2 is a drawing illustrating one example of the control unit and substrate processing unit of the substrate processing apparatus.

Hereinafter, the control system 111 and substrate processing unit 113 will be described in more detail. FIG. 2 is a drawing showing one example of the control system 111 and substrate processing unit 113. In the drawing, the substrate processing unit 113 is composed of the so-called vertical-type heating apparatus, and is shown in a cross section.

The substrate processing unit 113 includes a reaction vessel 2 of a double-tube structure that is composed of an inner vessel 2a and an outer vessel 2b respectively formed from, for example, quartz. In this case, a metallic and tubular manifold 21 is provided at a bottom end of the reaction vessel 2.

The inner vessel 2a is opened at its top end, and is supported by the inside of the manifold 21. The outer vessel 2b is closed at its top end, and is airtightly joined, at its bottom end, to a top end of the manifold 21.

In the reaction vessel 2, a wafer boat 23, which serves as a holding tool, is located. The wafer boat 23 is held on a cover 24 via a heat insulating mould (or heat insulating member) 25. On the wafer boat 23, multiple sheets of wafers W (including product wafers Wp and monitor wafers Wm1 to Wm5) each constituting a substrate are arranged. The arrangement of the wafers W on the wafer boat 23 will be further detailed later.

The cover 24 is mounted on a boat elevator 26 which is adapted for carrying in and carrying out the wafer boat 23 relative to the reaction vessel 2. When located in an upper limit position, the cover 24 closes a bottom end opening of the manifold 21, i.e., a bottom end opening of the processing vessel composed of the reaction vessel 2 and manifold 21.

A heater 3 composed of, for example, resistance heating elements, is provided around the reaction vessel 2. The heater 3 is divided into five sections, and each divided heater 31 to 35 is adapted for controlling a heating value, due to each corresponding power controller 41 to 45. In this example, the reaction vessel 2, manifold 21 and heater 3 constitute together a heating furnace.

To an inner wall of the inner vessel 2a, inner temperature sensors S1in to S5in, each composed of a thermocouple or the like, are provided respectively corresponding to the heaters 31 to 35. To an outer wall of the outer vessel 2b, outer temperature sensors S1out to S5out, each composed of a thermocouple or the like, are provided respectively corresponding to the heaters 31 to 35.

The interior of the inner vessel 2a can be considered as divided into five zones (zones 1 to 5), respectively corresponding to the heaters 31 to 35. Similarly, the wafers can be regarded as divided into five substrate groups G1 to G5, respectively corresponding to the zones (zones 1 to 5), in which the wafers are positioned, respectively. It is noted that the whole body of substrate groups G1 to G5 will be collectively referred to as a batch. Namely, all of the wafers mounted on the wafer boat 23 and placed in the reaction vessel 2 constitute together one batch that will be collectively subjected to a heating process.

The monitor wafers Wm are provided as monitor wafers Wm1 to Wm5, one for each of the substrate groups G1 to G5 (i.e., corresponding to each zone 1 to 5). Namely, each monitor wafer Wm1 to Wm5 is provided as the wafer (or substrate) that is representative of each substrate group G1 to G5, in a one-to-one correspondence relative to each zone 1 to 5.

In the manifold 21, a plurality of gas supply pipes are provided such that each necessary gas can be supplied into the inner vessel 2a. For convenience, however, exemplary two gas supply pipes 51, 52 are shown in FIG. 2. In the middle of the gas supply pipes 51, 52, flow-rate control units 61, 62, such as mass-flow controllers or the like, and/or valves (not shown) are provided for controlling gas flow rates, respectively.

In addition, an exhaust pipe 27 is connected with the manifold 21 such that it can evacuate the gas from a space between the inner vessel 2a and the outer vessel 2b. The exhaust pipe 27 is in turn connected with a vacuum pump (now shown). In the middle of the exhaust pipe 27, a pressure control unit 28 is provided. The pressure control unit 28 includes a means, such as a butterfly valve, a valve driving unit, etc., for controlling the pressure in the reaction vessel 2.

The control system 111 is adapted for controlling process parameters, such as temperature of a processing atmosphere in the reaction vessel 2, pressure in the reaction vessel 2 and each gas flow rate. To the control system 111, each measurement signal is inputted from the temperature sensors S1in to S5in and S1out to S5out, and control signals are then outputted form the control system 111 to the power controllers 41 to 45 for the heater 3, pressure control unit 28 and flow-rate control units 61, 62, respectively.

(Arrangement of the Wafers W)

Figure 3:
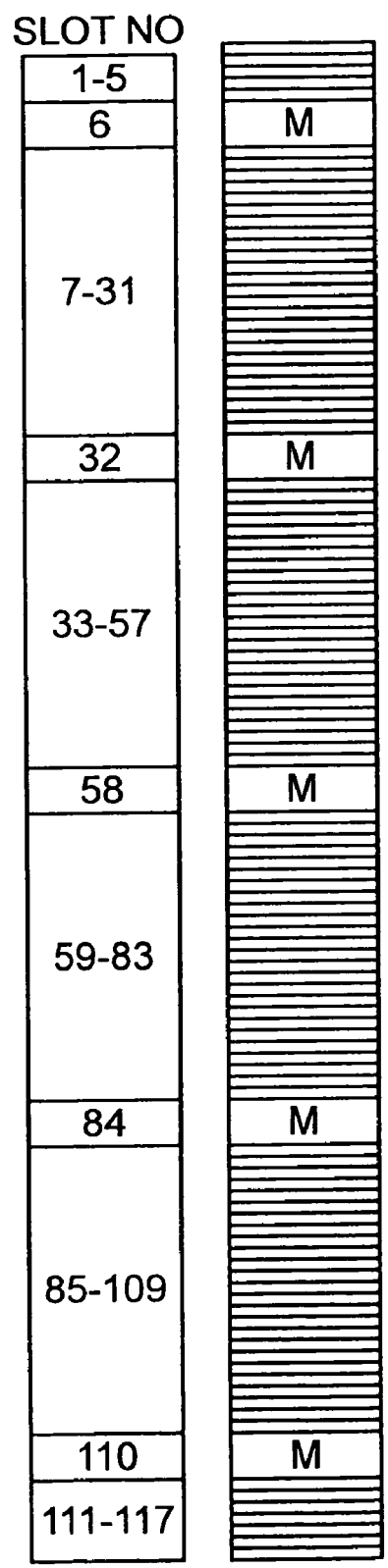
FIG. 3 is a schematic diagram illustrating one example of arrangement of the wafers on a wafer boat.

FIG. 3 is a schematic diagram showing one example of the arrangement of the wafers W on the wafer boat 23. The wafer boat 23 includes slots (or grooves) each adapted for arranging one wafer W therein. With such arrangement of the wafers W in the slots, each of the wafers W can take a horizontal attitude with a gap in a vertical direction, so that they can be arranged in a multistage fashion. In the example shown in FIG. 3, the wafers W are arranged in one hundred and seventeen (117) slots, respectively. The position of each wafer W can be identified by a slot number (Slot No.) assigned to each slot from the top of the wafer boat 23.

As the wafers W arranged on the wafer boat 23, there are three kinds of wafers, i.e., the product wafers Wp, monitor wafers Wm and dummy wafers Wd.

The product wafers Wp are used for producing the semiconductor devices. In this example, the product wafers Wp will be described as unprocessed wafers Wn (i.e., the wafers W that are not yet processed (or not subjected to the film-forming process) in the substrate processing unit 113).

The monitor wafers Wm are used for monitoring the thickness of the film formed on each product wafer Wp. In order to match the process condition, the wafers W having substantially the same size and material as those of the product wafers Wp should be used as the monitor wafers Wm. In this example, the unprocessed wafers Wn are used as the monitor wafers Wm. In this case, the monitor wafers Wm1 to Wm5 are located in separate positions respectively corresponding to the slot numbers 6, 32, 58, 84 and 110.

The dummy wafers Wd are used for enhancing uniformity of the product wafers Wp. Namely, positions around top and bottom ends of the wafer boat 23 are boundaries between the outside and the wafers W arranged in the multistage fashion, respectively. Therefore, the film thickness of the wafers W around such positions is likely to be different from that of the wafers located in the other positions. Accordingly, with the dummy wafers Wd respectively positioned around the top and bottom ends of the wafer boat 23, the uniformity of the film thickness between the product wafers Wp (or uniformity between the wafers) can be securely examined.

In view of the production cost, it is preferred to use processed wafers Wy (i.e., the wafers W that have been already processed (or subjected to the film forming process) in the substrate processing unit 113) are used as the dummy wafers Wd. The same dummy wafers Wd can be repeatedly used, as such further reduction of the production cost for the semiconductor devices can be achieved. Otherwise, if using the unprocessed wafers Wn as the dummy wafers Wd, such unprocessed wafers Wn should be prepared each time the product wafers Wp are processed, leading to significant increase of the production cost for the semiconductor devices.

However, the use of the processed wafers Wy as the dummy wafers Wd may have some influence on the film thickness of the individual product wafer Wp. This is because the amount of consumption of the reaction gas should vary with the surface condition of each wafer W (or with presence or absence of the film formed on the wafer W). This phenomenon will be described in more detail with respect to the following relationships (1) and (2).

(1) Relationship Between the Concentration of the Reaction Gas and the Film-forming Amount The reaction gas is supplied from each gas introducing port of the gas supply pipes 51, 52 located at a bottom portion of the inner vessel 2a, and then discharged from a top portion of the inner vessel 2a. In a period of time during which the reaction gas travels from the bottom portion to the top portion of the inner vessel 2a, the reaction gas is consumed for the film formation on each wafer W, and hence the concentration of the reaction gas is gradually lowered. Thus, the concentration of the reaction gas is relatively high around each gas introducing port (i.e., the bottom portion of the inner vessel 2a), while it is lowered as one moves away from the gas introducing port. Eventually, the concentration of the reaction gas at a point far away from the gas introducing port (or around the top portion of the inner vessel 2a) should be significantly reduced. Therefore, corresponding to the distribution or gradient of concentration of the reaction gas, the thickness of each wafer W may tend to be greater (i.e., the film-forming rate becomes higher) in the vicinity of each gas introducing port, while reduced (i.e., the film-forming rate becomes lower) at the point far away from the gas introducing port.

Such distribution of the gas concentration depends on the distance from each gas introducing port as well as on conditions on the route from the gas introducing port to the top portion of the inner vessel 2a (e.g., the surface condition and surface area of each wafer W and conditions of the inner vessel 2a, etc.). The influence, caused by such conditions, on the concentration of the reaction gas, is less in the vicinity of each gas introducing port (or around the bottom portion of the inner vessel 2a), while more conspicuous at the point far away from the gas introducing port (or around the top portion of the inner vessel 2a). As is seen from the above discussion, the surface condition of the each wafer W located on the route for the reaction gas has significant influence on the distribution of concentration of the reaction gas as well as on the thickness of the film formed on the wafer W (or uniformity of the film thickness between the wafers).

(2) Relationship Between the Surface Condition of Each Wafer W and the Amount of Consumption of the Reaction Gas Next, the relationship between the surface condition of each wafer W and the amount of consumption of the reaction gas will be described in more detail. Of course, the amount of consumption of the reaction gas varies with the difference between the unprocessed wafers Wn and the processed wafers Wy. Usually, the film-forming rate is relatively low with the unprocessed wafers Wn, while it is relatively high with the processed wafers Wy. This is attributable to affinity of the material constituting the surface of the wafer W relative to the material constituting the film. If the material constituting the surface of the wafer W is the same as the material constituting the film (the wafers W=the processed wafers Wy), transformation from the reaction gas to the film can proceed rapidly due to a greater affinity between the two materials (i.e., the film-forming rate is relatively high), as such increasing the amount of consumption of the reaction gas. However, if the material constituting the surface of the wafer W is different from the material constituting the film (the wafers W=the unprocessed wafers Wn), the transformation from the reaction gas to the film is substantially delayed (i.e., the film-forming rate is lowered), as such reducing the amount of consumption of the reaction gas.

Therefore, when using the unprocessed wafers Wn arranged in the multistage fashion in the reaction vessel, the gradient of concentration of the reaction gas and hence fluctuation of the film thickness between the wafers can be reduced, as such providing more excellent uniformity between the wafers. On the other hand, when using the processed wafers Wy arranged in the multistage fashion in the reaction vessel, the gradient of concentration of the reaction gas and hence fluctuation of the film thickness between the wafers are likely to be increased, leading to deterioration of the uniformity of the film thickness between the wafers.

This applies to the case in which the reaction gas reacts on the surface of each wafer W so as to form the film thereon (i.e. an interface rate-limiting reaction), and especially applies to the film-forming process by CVD. Meanwhile, in the case in which the film is formed by diffusion of the reaction gas into each wafer W (i.e., a diffusion controlled reaction), such as by oxidation, the reaction will not always correspond to such a tendency as seen in the interface rate-limiting reaction. Namely, in the case of the diffusion controlled reaction, not only the presence or absence of the film, but also the film thickness, may have substantial influence on the amount of consumption of the reaction gas.

However, such a difference in the amount of consumption of the reaction gas between the unprocessed wafers Wn and the processed wafers Wy can apply to either of the interface rate-limiting reaction and the diffusion controlled reaction.

(3) Surface Condition of Each Wafer W and Estimation of the Film Thickness

As described above, the surface condition of each wafer W (or presence or absence of the film formed on the wafer W)

has substantial influence on the amount of consumption of the reaction gas. This means that the arrangement of the processed wafers Wy among the wafers W arranged in the multistage fashion has some impact on the film formation onto each wafer W (or distribution of the film thickness between the wafers). Accordingly, it is necessary to estimate the film thickness, while taking into account the arrangement of the processed wafers Wy.

In addition to the surface condition of each wafer W, the surface area of the wafer W also has some impact on the amount of consumption of the reaction gas. Namely, the surface area of the wafers W can be utilized as a factor for estimating the film thickness. However, in the discussion provided below, the surface area of the wafers W will not be used as the factor for estimating the film thickness.

(Operation of the Substrate Processing System 100)

Figure 4:
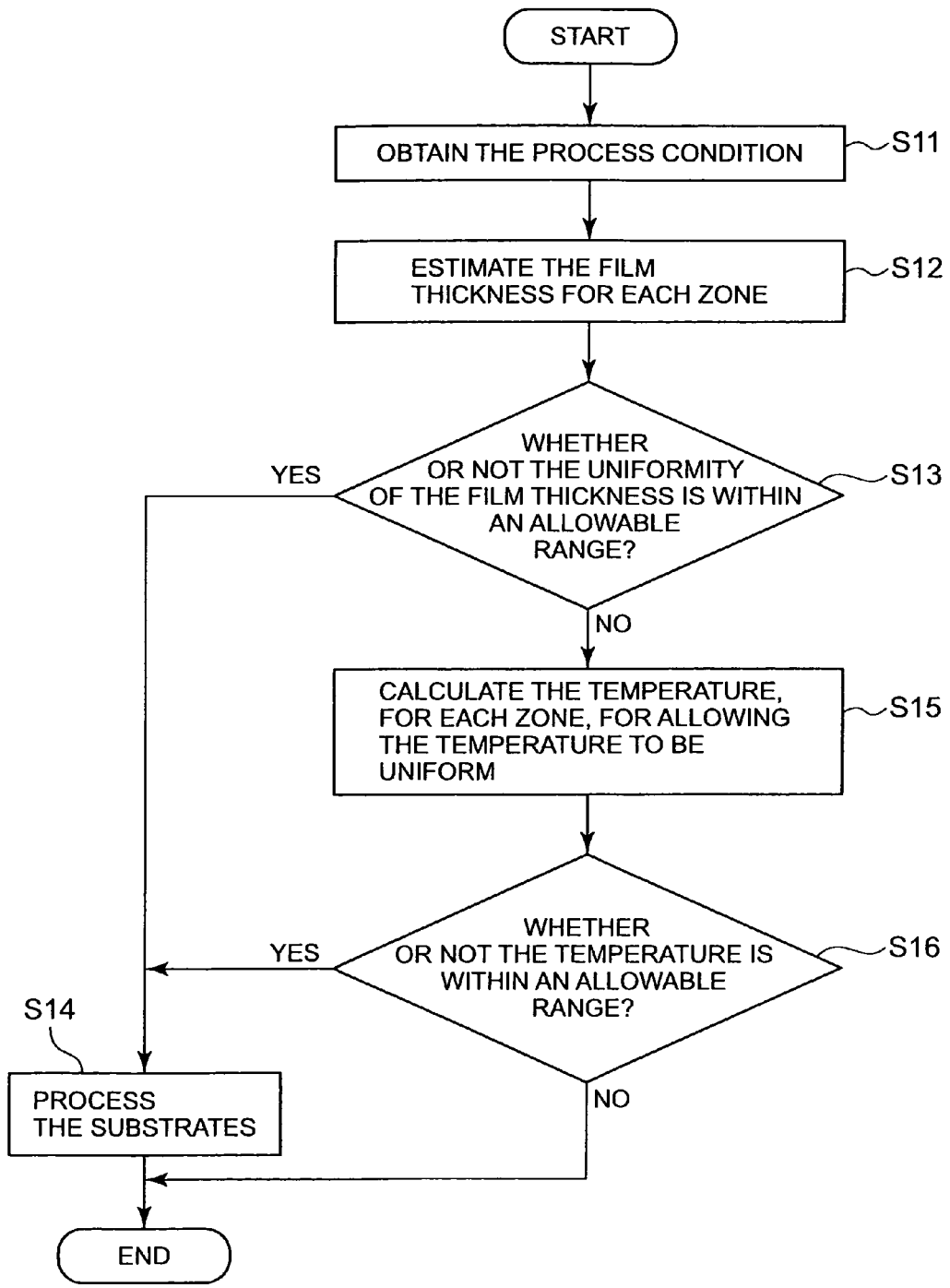
FIG. 4 is a flow chart illustrating one example of an operational procedure of the substrate processing system.

Hereinafter, the operation of the substrate processing system 100 will be described. FIG. 4 is a flow chart illustrating one example of an operational procedure of the substrate processing system 100, and FIG. 5 is an event flow chart illustrating one example of a flow of events performed in the substrate processing system 100.

A. Preparations for the Process

Figure 5:
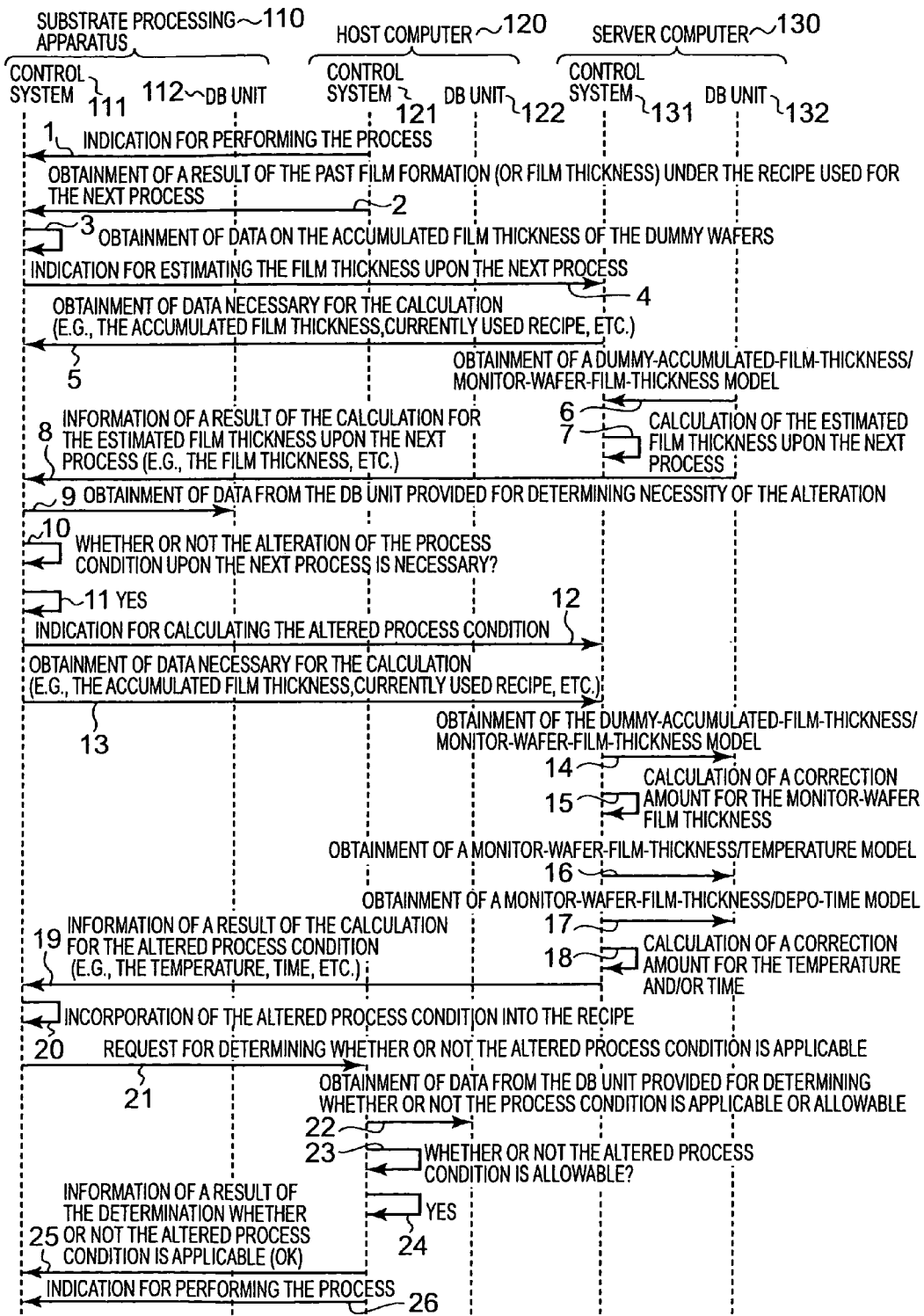
FIG. 5 is an event flow chart illustrating one example of a flow of events respectively performed in the substrate processing system.

First of all, the process for the substrates or wafers is prepared (Events 1 to 3 shown in FIG. 5).

(1) The control system 121 of the host computer 120 directs the control system 111 of the substrate processing apparatus 110 to perform the process (Event 1) and obtains a result of the past film formation (or film thickness) under a recipe that will be performed next time (Event 2).

Namely, the control system 121 obtains the result of the film formation upon a previous process performed under the recipe that will be performed next time. As used herein, the term "recipe" means the process condition for the wafers W (e.g., the set temperature, gas flow rate, pressure, processing time, etc.). In this case, measurement results for the film thickness are obtained, for a plurality of points (for example, nine (9) points), for each of the monitor wafers Wm1 to Wm5. Each position of the monitor wafers Wm and each measurement point can be indicated by each corresponding slot number and each in-plane measurement point (x[mm], y[mm]), respectively.

(2) The pattern obtaining unit 111b of the control system 111 of the substrate processing unit 110 obtains information concerning the position and accumulated film thickness of each dummy wafer Wd (Event 3). This means that the pattern obtaining unit 111b obtains information concerning an arrangement pattern indicative of each arrangement of the unprocessed substrates and processed substrates among the plurality of substrates. The accumulated film thickness on each dummy wafer Wd can be estimated, from the total processing time of the dummy wafer Wd, the number of times the wafer Wd has been used, and the like. Otherwise, the accumulated film thickness may be automatically measured by using the film-thickness meter 141. Alternatively or additionally, an operator may input each measurement result into the control system 111.

In this case, the accumulated film thickness D of each dummy wafer Wd upon the previous process under the recipe that will be performed next time and the accumulated film thickness D of the dummy wafer Wd upon a next process are obtained. In this manner, the accumulated thickness D are obtained for all of the dummy wafers Wd. Similarly, each position of the dummy wafers Wd can be indicated by each corresponding slot number.

The accumulated film thickness D means the thickness of the films accumulated on each dummy wafer Wd through all of the processes. Hence, the accumulated film thickness D is increased each time the dummy wafer Wd is used or processed repeatedly. As the dummy wafers Wd, both of the unprocessed wafers Wn and processed wafers Wy may be used. Usually, the unprocessed dummy wafers Wn are used as the dummy wafers Wd to be used anew or first. Of course, the dummy wafers Wd that have been used even only once should then be used as the processed dummy wafers Wy. Usually, such used or processed dummy wafers will be further used repeatedly.

B. Estimation of the Film Thickness

The control system 131 of the server computer 130 first obtains information necessary for estimating the film thickness, such as the process condition used upon the next process and the like, then estimates the film thickness for each zone 1 to 5, and thereafter informs the control system 111 of the substrate processing unit 110 of the result of estimation (Steps S11, S12 shown in FIG. 4 and Events 4 to 8 shown in FIG. 5). Hereinafter, this operation will be described in more detail.

The control system 111 directs the control system 121 to estimate the film thickness that will be measured upon the next process (Event 4). Then, the control system 121 obtains data (or film-thickness estimating data) necessary for estimating the film thickness measured upon the next process, from the control system 111 (Event 5), as well as obtains a model (or film-thickness estimating model) necessary for estimating the film thickness, from the film-forming-amount model DB unit 132 (Event 6). Thereafter, the control system 121 calculates the estimated film thickness (Event 7), and informs control system 111 of the calculated result (Event 8).

(1) Film-thickness Estimating Data

As the film-thickness estimating data, the following factors (1) to (4) can be mentioned.

(1) The accumulated film thickness of each dummy wafer Wd upon the previous process.

(2) The accumulated film thickness of each dummy wafer Wd upon the next process.

These data of (1) and (2) correspond to each accumulated film thickness obtained in the Event 3, respectively.

(3) The recipe used upon the previous process (i.e., the set temperature, gas flow rate, pressure and processing time).

In this factor, the set temperature [° C.] means the temperature used in the film forming process, and is set for each. The gas flow rate [sccm] is set for each gas (e.g., $SiH_2Cl_2$, $NH_3$, $N_2$, $O_2$, etc.) used for the reaction gas. The pressure [Torr] is designated herein as the total pressure. The processing time [min] is the time required for the film forming process. As used herein, the film-forming process means a process for forming the film on each wafer W by heating the wafer W and allowing the wafer to be exposed to the reaction gas.

(4) The recipe used upon the next process (i.e., the set temperature, gas flow rate, pressure and processing time) and a target film thickness Dt.

The details of the recipe used upon the next process are respectively set, similarly to the recipe used upon the previous process. In addition, the target film thickness Dt is set anew.

(2) Film-thickness Estimating Model

The film-thickness estimating model is used for estimating fluctuations of the film thickness due to fluctuations of the surface condition of each dummy wafer Wd. This model corresponds to the arrangement/film-forming-amount model indicative of the influence on the film-forming amount on each substrate due to the arrangement of unprocessed substrates and processed substrates among the plurality of substrates. With such a film-thickness estimating model, the film thickness of each monitor wafer Wm can be estimated, corresponding to the arrangement of the processed wafers Wy relative to the dummy wafers Wd.

In this case, the film thickness of each monitor wafer Wm is estimated, based on a degree of influence, i.e., $\alpha$ (S, N), as defined below. Namely, this degree of influence $\alpha$ (S, N) can be considered herein as the film-thickness estimating model.

The degree of influence $\alpha$ (S, N) is a parameter indicative of influence exerted on the film thickness of each monitor wafer Wm per sheet of the processed wafer Wy, when the processed wafers Wy are arranged from each gas introducing port up to the monitor wafer Wm. Such a degree of influence $\alpha$ (S, N) can be expressed by the following equation (1).

$$\alpha(S, N) = (D0 - DN)/N \quad (1)$$

wherein

S: an identifier for identifying the position of the monitor wafer Wm (e.g., the slot number);

N: the number of sheets of the processed wafers Wy arranged on the route for the reaction gas, from the gas introducing port up to the monitor wafer Wm (i.e., the number of sheets of the processed wafers on the route);

DN: the film thickness of the monitor wafer Wm when the number of sheets of the processed wafers on the route is N; and D0: the film thickness of the monitor wafer Wm when the number of sheets of the processed wafers on the route is zero (0) (i.e., the unprocessed wafers Wn are arranged in all of the slots on the route).

As one example, the monitor wafer Wm located at a slot number 110 will be discussed. Now, assume that the film thickness D0 of the monitor wafer Wm, in the case in which the unprocessed wafers Wn are arranged in all of the slots assigned with the slot numbers 111 to 117 on the route for the reaction gas, is 29.21 nm. Furthermore, assume that the film thickness DN of the monitor wafer Wm, in the case in which the processed wafers Wy are arranged in all of the slots assigned with the slot numbers 111 to 117 on the route for the reaction gas, is 29.00 nm.

In this case, the degree of influence $\alpha$ (S, N) [nm/sheet] (i.e., the degree of influence $\alpha$ indicative of the influence exerted on the film thickness of the monitor wafer Wm located at the slot number 110 per sheet of the processed wafer Wy) can be calculated as follows:

$$a = (29.21 \text{ [nm]} - 29.00 \text{ [nm]})/7 \text{ [sheets]}$$
$$= 0.03 \text{ [nm/sheet]}$$

Of course, the degree of influence $\alpha$ (S, N) varies with the position (or identifier S) in which the monitor wafer Wm is located and the number of sheets of the processed wafers on the route (N). Accordingly, by obtaining the degrees of influence $\alpha$ (S, N) with respect to all of the monitor wafers Wm (all of the slots in which the monitor wafers Wm are respectively located) and the number of sheets of the processed wafers on the route (N), the film thickness of each monitor wafer Wm corresponding to the arrangement of the processed wafers Wy can be estimated.

Because of a great total number of wafers W (e.g., 117 sheets), it is quite difficult to obtain the degrees of influence $\alpha$ (S, N) for all of the wafers W. Therefore, for convenience and clarity, it should be appreciated that the degree of influence $\alpha$ (S, N) is assumed to be constant, for each range defined by dividing the number of sheets of the processed wafers on the route (N) into a plurality of sections. Although the degree of influence $\alpha$ (S, N) changes with the number of sheets of the processed wafers on the route (N) (generally, it is increased with increase of the number of sheets of the processed wafers on the route (N)), the change is not so large. Therefore, even though assumed to be constant for each divided range, such a change of the degree of influence $\alpha$ (S, N) actually measured for each divided range has almost no serious impact on the estimation of the film thickness of the wafers located therein.

For instance, by setting each arrangement pattern (or arranged number) of the processed wafers Wy as follows, the degree of influence $\alpha$ (S, N) can be derived efficiently.

In the example shown in FIG. 3, the monitor wafers Wm are located in the positions of slot numbers 6, 32, 58, 84, 110, respectively. Meanwhile, in the remaining positions of slot numbers 1 to 5, 7 to 31, 33 to 57, 59 to 83, 85 to 109 and 111 to 117, the unprocessed wafers Wn and/or processed wafers Wy are located. In this case, the ranges corresponding to the slot numbers 1 to 5, 7 to 31, 33 to 57, 59 to 83, 85 to 109 and 111 to 117 will be referred to as areas 6 to 1, respectively. Namely, these ranges will be referred to as the areas 1 to 6 from one nearer to the introducing ports of the reaction gas.

Arrangement pattern A: The unprocessed wafers Wn are arranged in all of the areas 1 to 6.

Arrangement pattern B: The processed wafers Wy are arranged in the area 1 and the unprocessed wafers Wn are arranged in the areas 2 to 6.

Arrangement pattern C: The processed wafers Wy are arranged in the areas 1 to 2, and the unprocessed wafers Wn are arranged in the areas 3 to 6.

Arrangement pattern D: The processed wafers Wy are arranged in the areas 1 to 3, and the unprocessed wafers Wn are arranged in the areas 4 to 6.

Arrangement pattern E: The processed wafers Wy are arranged in the areas 1 to 4, and the unprocessed wafers Wn are arranged in the areas 5 to 6.

Arrangement pattern F: The processed wafers Wy are arranged in the areas 1 to 5, and the unprocessed wafers Wn are arranged in the area 6.

Namely, by setting each arrangement pattern A to F as described above, the number of sheets of the processed wafers on the route (N) can be divided into the five ranges: 0 to 7, 8 to 32, 33 to 57, 58 to 82 and 83 to 107.

A simplified film-thickness estimating model can be prepared in the following procedure (1) to (4).

(1) The wafers W are processed under the same recipe (or process condition) for all of the arrangement patterns A to F.

(2) The film thicknesses of the monitor wafers Wm1 to Wm5 for the respective arrangement patterns A to F are measured. In this case, the measurement may be omitted for a part of the monitor wafers Wm1 to Wm5. For instance, for the monitor wafer Wm located at the slot number 6, the measurement only for the arrangement patterns A, B can satisfy a necessary condition. As such, further measurement for the arrangement patterns C to F is not required. Namely, in each of the arrangement patterns C to F, the number of sheets of the processed wafers on the route (N) is the same as that in the arrangement pattern B, and therefore the film thickness of the monitor wafer Wm can be considered to be substantially the same in these patterns.

(3) The degree of influence $\alpha$ (S, N1 to N2) is calculated, for each divided number of sheets of the processed wafers on the route (N1 to N2).

For instance, the degree of influence $\alpha$ (S, 8 to 32) [nm/sheet], for the divided number of sheets of the processed wafers on the route (8 to 32) for the monitor wafer Wm located at the slot 58, can be calculated as follows.

α(S, 8 to 32)=((Difference of the film thickness between the patterns A, C at the slot 58)/the number of sheets of the processed wafers on the route at the slot 58)=(29.90 [nm]−28.94 [nm])/32 [sheets]=0.03 [nm/sheets]

(4) By bringing all of the calculated degress of influence α (S, N1 to N2) together, the film-thickness estimating model can be prepared.

FIG. 6 shows one example of the so-prepared film-thickness estimating model. In this case, the film-thickness estimating model (or arrangement/film-forming amount model) is expressed by using a triangular matrix.

(4) Estimation of the Film Thickness

An estimated film thickness for each monitor wafer Wm upon the next process can be calculated by using the film-thickness estimating model.

As one example, the monitor wafers Wm are located at the slots 6, 32, 58, 84, 110, and the unprocessed wafers Wn and processed wafers Wy are arranged as follows, upon the previous process and upon the next process, respectively.

(Upon the previous process) Unprocessed wafers Wn: Slot numbers 1 to 109

Processed wafers Wy: Slot numbers 111 to 117

(Upon the next process) Unprocessed wafers Wn: Slot numbers 1 to 96

Processed wafers Wy: Slot numbers 96 to 109, 111 to 117

In the case of calculating the film thickness of the monitor wafer Wm located at the slot 110, the number of sheets of the processed wafers on the route (N) is the same (i.e., seven (7) sheets) upon the previous process as well as upon the next process. Therefore, upon both of the previous and next processes, the degree of influence α (S110, 0 to 7) is the same. Meanwhile, in the case of calculating the film thickness of the monitor wafer Wm located at the slot 84, the number of sheets of the processed wafers on the route (N) upon the previous process (i.e., 7 sheets) is different from that upon the next process (i.e., 21 sheets). Therefore, the degrees of influence α (S84, 0 to 7) and α (S110, 8 to 32) are applied to the previous process and next process, respectively.

Generally, the estimated film thickness $D_{n+1}$ of each monitor wafer Wm can be calculated by the following equation:

$$D_{n+1}=D_n+\alpha(S, N1_n \text{ to } N2_n)\times N_n-\alpha(S, N1_{n+1} \text{ to } N2_{n+1})\times N_{n+1}$$

wherein $D_n$: the film thickness of the monitor wafer Wm upon the previous process;

$N_n$: the number of sheets of the processed wafers on the route upon the previous process ($N1_n<N_n<N2_n$); and $N_{n+1}$: the number of sheets of the processed wafers on the route upon the next process ($N1_{n+1}<N_{n+1}<N2_{n+1}$).

For instance, the estimated film thickness $D_{n+1}$ of the monitor wafer Wm located at the slot 84 upon the next process can be calculated as follows:

$$\begin{aligned}D_{n+1} &= D_n + a(S84, 0 \text{ to } 7) \times N_n - \\ &\quad a(S84, 8 \text{ to } 32) \times N_{n+1} \\ &= 29.90 \text{ [nm]} + 0.03 \text{ [nm/sheet]} \times 7 \text{ [sheets]} - \\ &\quad 0.03 \text{ [nm/sheet]} \times 21 \text{ [sheets]} \\ &= 29.48 \text{ [nm]}\end{aligned}$$

Similarly, the estimated film thickness $D_{n+1}$ for the other monitor wafers Wm can also be calculated.

FIG. 7 shows the estimated film thicknesses $D_{n+1}$ respectively obtained by the calculation as described above.

This calculation for the estimated film thicknesses $D_{n+1}$ is performed by the calculation unit of the control system 131, while using each arrangement pattern obtained by the pattern obtaining unit 111b.

C. Determination Whether or Not the Process Condition Should be Altered

The determination unit 111c of the control system 111 of the substrate processing apparatus 110 determines whether or not the process condition should be altered (whether or not the uniformity of the estimated film thickness is within an allowable range) (Step S13 shown in FIG. 4 and Events 9 to 11 shown in FIG. 5). Based on a result of the determination, the next process is started, or otherwise an alteration of the process condition (or selection (or calculation) of a new process condition) is indicated (Step S15 shown in FIG. 4 and Events 12 to 16 shown in FIG. 5). Hereinafter, this procedure will be described in more detail.

After informed about the estimated film thickness by the control system 131, the determination unit 111c of the control system 111 obtains the reference film-thickness table from the reference film-thickness DB unit 112 (Event 9). Then, the determination unit 111c determines whether or not the process condition upon the next process should be altered (Event 10). If the alteration of the process condition is not required (Event 11), the next process is started by the control unit 111a (Event 26). Meanwhile, if the alteration of the process condition is required, the control system 111 directs the control system 131 to select a next process condition (Event 12).

FIG. 8 is a schematic diagram showing one example of the reference film-thickness table.

In this example, the following factors (1) to (5) are used as reference values for the determination:

(1) an upper limit Dmu [nm] of an average film thickness Dm for all of the monitor wafers Wm1 to Wm5;

(2) a lower limit Dmd [nm] of the average film thickness Dm for all of the monitor wafer Wm1 to Wm5;

(3) an upper limit Du [nm] of a film thickness (or average film thickness) D of each monitor wafer Wm1 to Wm5;

(4) a lower limit Dd [nm] of the film thickness (or average film thickness) D of each monitor wafer Wm1 to Wm5; and (5) a face to face uniformity Uf (=(D1max−D1min)×100/(D1m×2)) [%], wherein D1max: the maximum value of the film thickness of each monitor wafer Wm1 to Wm5;

D1min: the minimum value of the film thickness of each monitor wafer Wm1 to Wm5; and D1m: an average value of the film thickness of each monitor wafer Wm1 to Wm5.

Although all of these factors (1) to (5) can be used as the reference values for the determination, a part of these factors may be used as the references. Namely, if all or a certain part of the factors (1) to (5) do not satisfy predetermined conditions or get out of predetermined ranges, respectively, the alteration of the process condition will be determined to be necessary.

D. Alteration of the Process Condition (or calculation of the Set Temperature for Each Zone 1 to 5)

When the alteration of the process condition is required (or when the film thickness is out of the allowable range), the control system 131 of the server computer 130 will calculate the next process condition (e.g., the set temperature for each zone 1 to 5), and send the result of calculation to the control system 111 of the substrate processing apparatus 110 (Step S15 shown in FIG. 4 and Events 13 to 19 shown in FIG. 5). Now, this operation will be described in more detail.

(1) Estimation of the Film Thickness

The calculation unit 131a of the control system 131 obtains data (or film-thickness estimating and temperature calculating data) necessary for estimating the film thickness and calculating the set temperature upon the next process, from the control system 111 (Event 13), as well as obtains the model (or film-thickness estimating model) necessary for estimating the film thickness, from the film-forming-amount model DB unit 132 (Event 14). Then, the calculation unit 131a of the control system 131 calculates the estimated film-thickness (Event 15). For the calculation of the estimated film thickness, a method and a procedure similar to the step S12 and Event 7 can be employed.

(2) Calculation of the Set Temperature

The temperature determination unit 131b of the control system 131 obtains a model (or set-temperature calculating model) necessary for calculating the set temperature, from the second memory unit 132b of the film-forming-amount model DB unit 132 (Events 16, 17), so as to calculate the set temperature (Event 18). Thereafter, the unit 131b sends the result of calculation to the control system 111 (Event 9). It is noted that the set-temperature calculating model corresponds to the temperature/film-forming-amount model indicative of the influence exerted on the film-forming amount on each substrate due to the process temperature for the substrate.

In this operation, the "temperature", especially the set temperature for each zone 1 to 5, that can allow the film thickness of each monitor wafer to correspond to the target film thickness Dt (or reference film thickness) is calculated.

The set temperature has a substantial impact on the film-forming rate. Generally, the film-forming rate is increased with a rise of the temperature, while decreased as the temperature is lowered. Accordingly, the temperature should be elevated in the case of the monitor wafers Wm each exhibiting a thinner film thickness than the target film thickness Dt, while lowered in the case of the monitor wafers Wm each provided with a thicker film thickness than the target film thickness Dt, thereby enhancing the uniformity of the film thickness for all of the wafers W.

It is commonly known that the growth rate (or film-forming rate) V of the film thickness, in an interface rate-limiting process, in which the film-forming rate is determined by a process performed on the surface of the film, such as by the CVD (Chemical Vapor Deposition), can be expressed by the following theoretical equation (10) (i.e., the Arrhenius equation):

$$V = C \cdot \exp(-Ea/(kT)) \qquad (10)$$

wherein

C: a process constant (i.e., a constant determined by the film-forming process);

Ea: activation energy (i.e., a constant determined by the kind of the film-forming process), for example, 1.8 [eV], in the case of forming an SiN film from the reaction gas consisting of $SiH_2Cl_2$ and $NH_3$;

k: the Boltzmann constant; and

T: the absolute temperature.

When the equation (10) is partially differentiated with respect to the temperature T and then transformed, the following equation (11) can be obtained.

$$dD/dT = D \times (Ea/(k \cdot T^2)) \ [nm/°C.] \qquad (11)$$

wherein

D: the film thickness; and dD/dT: a film-thickness-temperature coefficient K (an amount of change of the film thickness when the temperature is changed by 1° C.).

Accordingly, by substituting the activation energy Ea and absolute temperature T into the equation (11), the film-thickness-temperature coefficient K (=dD/dT) can be obtained.

For instance, when assuming that the set temperature is 760° C., the activation energy is 1.8 eV and the target film thickness Dt is 30 [nm], the film-thickness-temperature coefficient K can be obtained as 0.6 [nm/° C.], by substituting these values into the equation (11).

When considering the slot 6, if the set temperature is the same, the estimated film thickness will be 29.68 [nm] that is different, by 0.32 [nm], from the target film thickness Dt of 30 nm [nm]. Therefore, in order to obtain the amount of change of the temperature (=T1−T0) for compensating for such a difference, the difference of the film thickness should be divided by 0.6 [nm/° C.] that was obtained by the above calculation. Thus, 0.53 [° C.] can be obtained as a result of this division. Accordingly, by changing the temperature by the so-obtained 0.53° C., the film thickness estimated for the next process can be made equal to the target film thickness Dt.

As with the slot 6, a result of obtaining the optimum amount of change of the temperature for each monitor wafer Wm is shown in FIG. 9. Additionally, each set temperature is shown in FIG. 10. Namely, the set temperature that was the same (760° C.) for all of the zones upon the previous process is now changed for each zone 1 to 5.

Generally, the set temperature T1 is calculated as follows.

Namely, when the set temperature was T0 and the film thickness was D0 upon the previous process in the case of the target film thickness Dt, the set temperature upon the next process T1 is calculated in such a procedure as described below.

The film-thickness-temperature coefficient K (=dD/dt) can be expressed by the following equation (12).

$$K = (Dt - D0)/(T1 - T0) \qquad (12)$$

Assuming that the equation (11) is equal to the equation (12), and when the absolute temperature T is substituted by the set temperature T0, the following equation (13) can be derived.

$$T1 = T0 + [(Dt - D0)/Dt] \cdot [k \cdot T0^2/Ea] \qquad (13)$$

Since each of Ea, k, T0, Dt, D0 is known, the set temperature T1 upon the next process can be obtained from the equation (13).

In order to make the film thickness D equal to the target film thickness Dt, the set temperature T is controlled for each zone. In this case, the film-thickness-temperature coefficient K (=dD/dT) is calculated by using the equation (11). In other words, the film-thickness-temperature coefficient K is calculated on the premise that the Arrhenius equation (i.e., the equation (10)) can hold in any case. However, depending on the process condition and/or operational state of the apparatus, the Arrhenius equation may include some error for the reason that a value substituted as the activation energy Ea is not optimum, or the like. For correcting such an error, it may be effective to use a learning function. Namely, with repetition of calculation by using actually measured values, an actual relationship between the temperature and the film thickness can be grasped, more correctly, thereby achieving precise and fine control for the parameters used in the calculation based on the relationship. For such a learning function, the Kalman filter can be used.

E. Determination of Applicability of the Next Process Condition

In accordance with a request from the control system 111 of the substrate processing apparatus 110, the control system 121 of the host computer 120 determines whether or not the process condition is applicable (or whether or not the set temperature is within an allowable range) (Step S16 shown in FIG. 4 and Events 20 to 24 shown in FIG. 5). Hereinafter, this operation will be further detailed.

The control system 111 which received information about the altered process condition (e.g., the set temperature) by the control system 131 will incorporate the altered process condition into the recipe (Event 20), and direct the control system 121 to determined whether or not the process condition is applicable (or whether or not the set temperature is within the allowable range) (Event 21). Then, the control system 121 obtains a reference condition table from the reference condition DB unit 122 (Event 22), and thus determines whether or not the altered process condition is applicable (Events 23, 24). As a result, if the altered process condition is judged to be applicable, the control system 121 indicates the start of the process to the control system 111. Thus, the control unit 111a directs the substrate processing apparatus 110 to start the process for the substrates.

FIG. 11 is a schematic diagram showing one example of the reference temperature table.

In this example, an upper limit value and a lower limit value of the temperature in each zone 1 to 5 are used as the reference temperature, respectively.

Although all of factors shown in FIG. 11 can be used as the reference values for the determination, a part of these factors may be used as the references. Namely, if all or a certain part of the factors satisfy predetermined conditions or fall within predetermined ranges, the alteration of the process condition will be determined to be applicable.

Other Embodiments

The present invention is not limited to the embodiment described above, but may be further extended and modified without departing from the technical scope of this invention. For instance, the number of the divided heaters is not limited to five (5). Additionally, the substrate processing apparatus 110, host computer 120 and server computer 130 may function alternately as needed relative to one another. For instance, by using only the substrate processing apparatus 110 or by using a combination of the substrate processing apparatus 110 and host computer 120, any steps and events shown in FIGS. 4, 5 can be substantially performed.

The invention claimed is:

1. A substrate processing system, comprising:
a substrate processing unit which is adapted for storing therein a plurality of substrates including unprocessed substrates and processed substrates respectively arranged in a multistage fashion as well as adapted for providing a heating process and a gas supplying process to the plurality of substrates, so as to form a film on each of the plurality of substrates;
a pattern obtaining unit adapted for obtaining information about an arrangement pattern concerning arrangement of the unprocessed substrates and processed substrates among the plurality of the substrates;
a first memory unit adapted for storing therein an arrangement/film-forming-amount model indicative of influence exerted on a film-forming amount on the substrates by the arrangement pattern concerning the arrangement of the unprocessed substrates and processed substrates among the plurality of substrates;
a calculation unit adapted for calculating an estimated film-forming amount on the substrates, in the case of the arrangement pattern obtained by the pattern obtaining unit, based on the arrangement/film-forming-amount model stored in the first memory unit;
a determination unit adapted for determining whether or not the estimated film-forming amount calculated by the calculation unit is within a predetermined range; and
a control unit adapted for controlling and driving the substrate processing unit to process the substrates when the estimated film-forming amount calculated by the calculation unit is determined to be within the predetermined range.

2. The substrate processing system according to claim 1, wherein the calculation unit further calculates the estimated film-forming amount on a plurality of monitor substrates included in the plurality of substrates, and
wherein the determination unit further determines whether or not the estimated film-forming amount and uniformity thereof on each of the plurality of monitor substrates are within predetermined ranges, respectively.

3. The substrate processing system according to claim 1, further comprising:
a second memory unit adapted for storing therein a temperature/film-forming-amount model indicative of influence exerted on the film-forming amount on the substrates by a processing temperature for the substrates; and
a temperature determination unit adapted for determining the processing temperature, based on the temperature/film-forming-amount model stored in the second memory unit, when the estimated film-forming amount calculated by the calculation unit is determined to be out of the predetermined range;
wherein the control unit controls the substrate processing unit, based on the processing temperature determined by the temperature determination unit.

4. The substrate processing system according to claim 3, wherein the substrate processing unit includes a plurality of heating units each adapted for heating the substrates, and
wherein the temperature determination unit determines a processing temperature corresponding to each of the plurality of heating units, based on the temperature/film-forming-amount model stored in the second memory unit, when uniformity of the estimated film-forming amount calculated by the calculation unit is determined to be out of predetermined range.

5. A control method for controlling a substrate processing apparatus which is adapted for storing therein a plurality of substrates including unprocessed substrates and processed substrates respectively arranged in multistage fashion as well as adapted for providing a heating process and a gas supplying process to the plurality of substrates, so as to form a film on each of the plurality of substrates, the method comprising the steps of:
obtaining information about an arrangement pattern concerning arrangement of the unprocessed substrates and processed substrates among the plurality of substrates;
calculating an estimated film-forming amount on the substrates, in the case of the arrangement pattern, based on an arrangement/film-forming-amount model indicative of influence exerted on a film-forming amount on the substrates by the arrangement pattern concerning the arrangement of the unprocessed substrates and processed substrates among the plurality of substrates;
determining whether or not the estimated film-forming amount calculated in the calculating step is within a predetermined range; and controlling the substrate processing apparatus when the estimated film-forming amount calculated in the calculating step is determined to be within the predetermined range.

6. A non-transitory storage medium storing therein a computer program configured for driving a computer to perform a control method for a substrate processing apparatus, wherein the method is configured for controlling the substrate processing apparatus which is adapted for storing therein a plurality of substrates including unprocessed substrates and processed substrates respectively arranged in a multistage fashion as well as adapted for providing a heating process and a gas supplying process to the plurality of substrates, so as to form a film on each of the plurality of substrates, and wherein the method comprises steps of:

obtaining information about an arrangement pattern concerning arrangement of the unprocessed substrates and processed substrates among the plurality of substrates;

calculating an estimated film-forming amount on the substrates, in the case of the arrangement pattern, based on an arrangement/film-forming-amount model indicative of influence exerted on a film-forming amount on the substrates by the arrangement pattern concerning the arrangement of the unprocessed substrates and processed substrates among the plurality of substrates;

determining whether or not the estimated film-forming amount calculated in the calculating step is within a predetermined range; and controlling the substrate processing apparatus when the estimated film-forming amount calculated in the calculating step is determined to be within the predetermined range.

* * * * *